United States Patent
Hwang et al.

(10) Patent No.: US 8,258,055 B2
(45) Date of Patent: Sep. 4, 2012

(54) METHOD OF FORMING SEMICONDUCTOR DIE

(75) Inventors: Chien Ling Hwang, Hsinchu (TW); Ying-Jui Huang, Taipei (TW); Zheng-Yi Lim, Hsinchu (TW); Yi-Yang Lei, Wuqi Township (TW); Cheng-Chung Lin, Taipei (TW); Chung-Shi Liu, Shinchu (TW)

(73) Assignee: Taiwan Semiconductor Manufacturing Company, Ltd. (TW)

( * ) Notice: Subject to any disclaimer, the term of this patent is extended or adjusted under 35 U.S.C. 154(b) by 126 days.

(21) Appl. No.: 12/832,168

(22) Filed: Jul. 8, 2010

(65) Prior Publication Data
US 2012/0007230 A1    Jan. 12, 2012

(51) Int. Cl.
*H01L 21/44*   (2006.01)
(52) U.S. Cl. ........................... 438/613; 257/737
(58) Field of Classification Search .................. 257/737, 257/E23.07, E21.295; 438/613, 614
See application file for complete search history.

(56) References Cited

U.S. PATENT DOCUMENTS

| | | | |
|---|---|---|---|
| 6,740,577 B2 * | 5/2004 | Jin et al. ........................ | 438/612 |
| 6,940,169 B2 * | 9/2005 | Jin et al. ........................ | 257/738 |
| 7,456,090 B2 * | 11/2008 | Chang et al. ................... | 438/613 |
| 2002/0086520 A1 * | 7/2002 | Chiang ........................... | 438/630 |
| 2003/0057559 A1 * | 3/2003 | Mis et al. ....................... | 257/762 |
| 2003/0157438 A1 * | 8/2003 | Tong et al. ..................... | 430/314 |
| 2004/0124171 A1 * | 7/2004 | Wu ................................ | 216/11 |

* cited by examiner

*Primary Examiner* — Thao P. Le
(74) *Attorney, Agent, or Firm* — Lowe Hauptman Ham & Berner, LLP

(57) ABSTRACT

An embodiment of the disclosure includes a conductive bump on a semiconductor die. A substrate is provided. A bond pad is over the substrate. An under bump metallurgy (UBM) layer is over the bond pad. A copper pillar is over the UBM layer. The copper pillar has a top surface with a first width and sidewalls with a concave shape. A nickel layer having a top surface and a bottom surface is over the top surface of the copper pillar. The bottom surface of the nickel layer has a second width. A ratio of the second width to the first width is between about 0.93 to about 1.07. A solder material is over the top surface of the cap layer.

16 Claims, 15 Drawing Sheets

METHOD OF FORMING SEMICONDUCTOR DIE

TECHNICAL FIELD

The disclosure relates generally to semiconductor packaging processes, and more particularly to a structure and methods of forming a conductive bump in a flip chip package.

BACKGROUND

Flip chip technology plays an important role in the packaging of semiconductor devices. A flip chip microelectronic assembly includes a direct electrical connection of face down electronic components onto substrates, such as circuit boards, using solder bumps as the interconnects. The use of flip chip packaging has dramatically grown as a result of the advantages in size, performance, and flexibility flip chips have over other packaging methods.

Recently, copper pillar technology has been developed. Instead of using solder bumps, electronic components are connected to substrates by means of a copper pillar. Copper pillar technology achieves finer pitch with minimum probability of bump bridging, reduces the capacitance load of the circuits, and allows the electronic components to perform at higher frequencies.

However, conventional solder bump and copper pillar manufacturing processes have shortcomings. For example, during the formation of a conventional solder bump, the solder is used as a mask to etch the underlying the under bump metallurgy (UBM) layer. However, the UBM layer may be attacked laterally in the etching process that results in an undercut of the UBM layer. The undercut of the UBM layer may induce stress during the solder bump manufacturing process. The stress may cause cracks in the underlying low dielectric constant (low-K) dielectric layers of the substrate. In copper pillar manufacturing processes, stress may cause cracks along the interface of the copper pillar and the solder used to bond the electronic component. The stress may also lead to cracks along the interface of the underfill and the copper pillar. The cracks may cause serious reliability concerns due to high leakage currents.

Accordingly, there is a need for an improved structure and method to form conductive pillar for a semiconductor wafer with robust electrical performance.

BRIEF DESCRIPTION OF THE DRAWINGS

Exemplary embodiments will be described with reference to the accompanying figures. It should be understood that the drawings are for illustrative purposes and are therefore not drawn to scale.

DETAILED DESCRIPTION

The making and using of illustrative embodiments are discussed in detail below. It should be appreciated, however, that the disclosure provides many applicable inventive concepts that can be embodied in a wide variety of contexts. The specific embodiments discussed are merely illustrative and do not limit the scope of the invention.

FIGS. 1 to 14 are cross-sectional views showing various stages during fabrication of a structure according to one or more embodiments. The term "substrate" as described herein, refers to a semiconductor substrate on which various layers and integrated circuit components are formed. The substrate may comprise silicon or a compound semiconductor, such as GaAs, InP, Si/Ge, or SiC. Examples of layers may include dielectric layers, doped layers, metal layers, polysilicon layers, and/or via plugs that may connect one layer to one or more other layers. Examples of integrated circuit components may include transistors, resistors, and/or capacitors. The substrate may be part of a wafer that includes a plurality of semiconductor dies fabricated on the surface of the substrate, wherein each die comprises one or more integrated circuits. The plurality of semiconductor dies are divided by scribe lines (not shown) between the dies. The following process steps will be performed on the plurality of semiconductor dies on the surface of the substrate.

Figure 1:
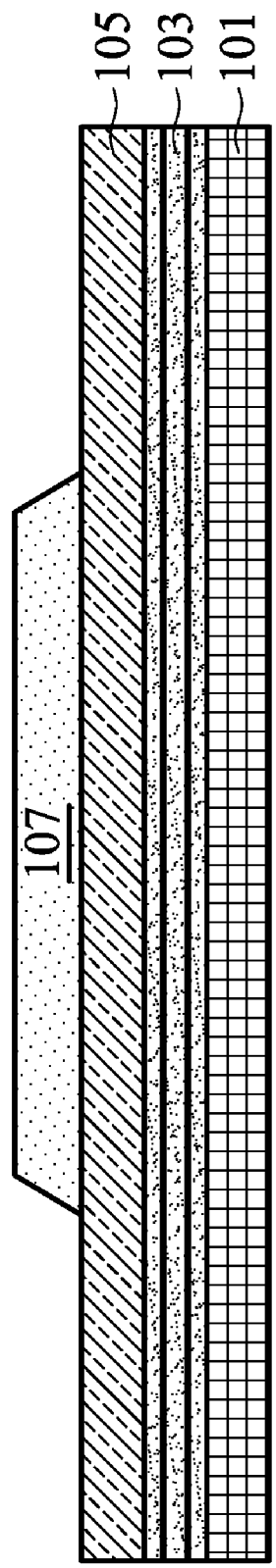
FIGS. 1 to 14 are cross-sectional views showing various stages during fabrication of a structure according to one or more embodiments.

Referring to FIG. 1, a portion of a substrate 101 with a plurality of semiconductor dies on the surface is provided. The portion of the substrate 101 in FIG. 1 contains only a portion of one of the plurality of dies. A plurality of interconnect layers 103 is formed on the surface of the substrate 101. The interconnect layers 103 include one or more conductive layers disposed within one or more dielectric layers. The conductive layers electrically connect integrated circuit components, and provide electrical connections from the integrated circuit components to the upper layers. The dielectric layer in the interconnect layers 103 may comprise, for example, low-k dielectric materials with dielectric constants (k value) between about 2.9 and 3.8, ultra low-k (ULK) dielectric materials with k values between about 2.5 and about 2.9, some combination of low-k dielectric materials, or the like. Typically the lower k value a dielectric layer has, the more fragile and prone to delamination and cracking the layer becomes.

A first passivation layer 105 is formed over the interconnect layers 103 to protect the integrated circuit components and interconnect layers 103 from damage and contamination. The first passivation layer 105 may be one or more layers, and typically includes a material such as undoped silicate glass (USG), silicon nitride (SiN), silicon dioxide ($SiO_2$), or silicon oxynitride (SiON). The first passivation layer 105 prevents or decreases moisture, mechanical, and radiation damage to the integrated circuits.

Still referring to FIG. 1, a bond pad 107 is formed over the first passivation layer 105. The bond pad 107 electrically contacts a conductive layer in the interconnect layers 103 and provides electrical connection to the underlying integrated circuit components. In one embodiment, the bond pad 107 may include an electrically conductive material such as aluminum, aluminum alloy, copper, copper alloy, or combinations thereof. The bond pad 107 can be deposited by physical vapor deposition (PVD) such as a sputtering deposition using a sputtering target comprising the conductive material followed by patterning the deposited layer for the bond pad 107 with photolithography and etching.

Figure 2:
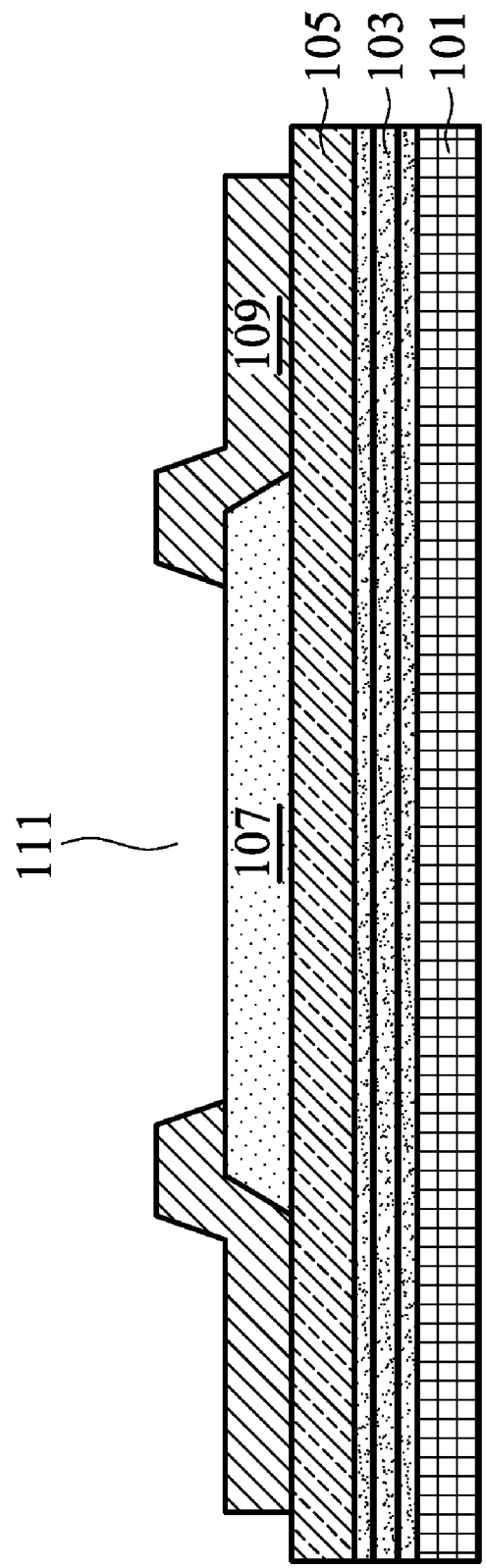

Referring to FIG. 2, a second passivation layer 109 is formed over the first passivation layer 105 and the bond pad 107. The second passivation layer 109 may comprise one or more layers of the exemplary materials previously listed for the first passivation layer 105. The first passivation layer 105 and second passivation layer 109 may have the same material or different materials. The second passivation layer 109 may be deposited over the first passivation layer 105 and the bond pad 107 by applicable deposition techniques, such as chemical vapor deposition (CVD). Photolithography and etching are performed following the deposition to selectively define an opening 111 in the second passivation layer 106 over the bond pad 107. The second passivation layer 109 partially covers the bond pad 107 and leaves a surface of the bond pad 107 in the opening 111 exposed. The second passivation layer 109 absorbs or releases thermal or mechanical stress caused by packaging of the substrate.

Figure 3:
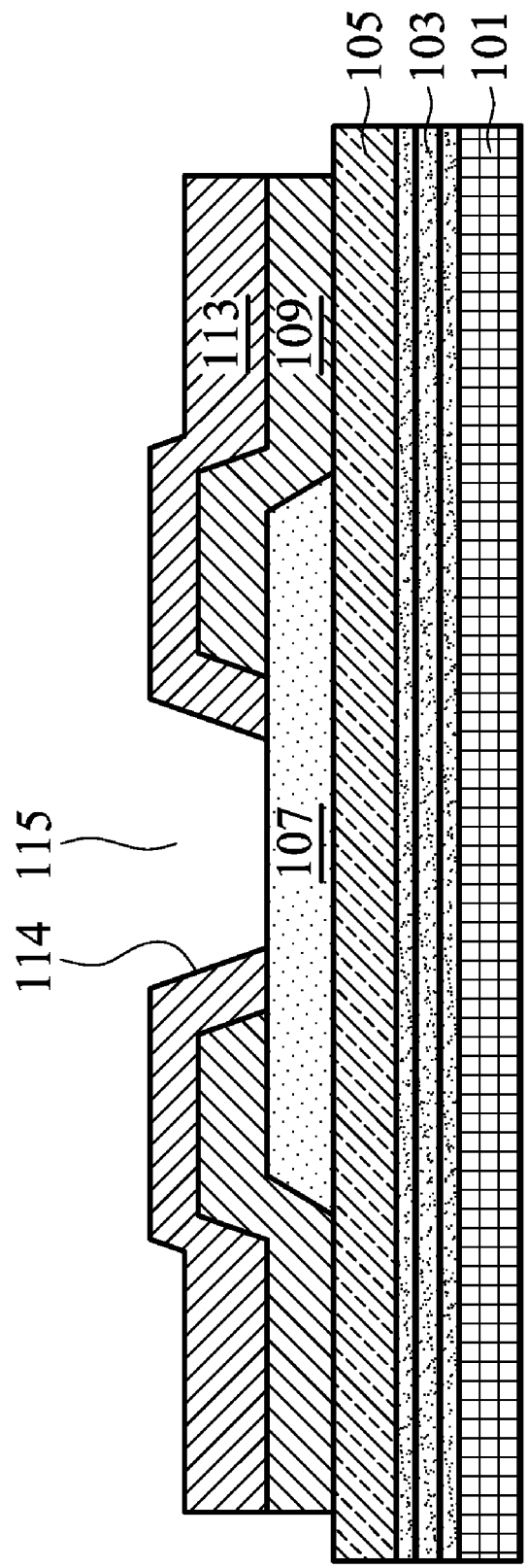

Referring to FIG. 3, a buffer layer 113 is formed over the second passivation layer 109 and the bond pad 107. The buffer layer 113 comprises polyimide, Polybenzobisoxazole (PBO), or epoxy, and has a thickness of between about 2 μm and about 10 μm. The buffer layer 113 serves as a stress buffer to reduce stress transfer to the first passivation layer 105 and the second passivation layer 109 during assembly process. In some embodiments, when first deposited the buffer layer 113 coats the second passivation layer 109 and fills into the opening 111 to cover the exposed surface of the bond pad 107. Deposition of the buffer layer 113 is followed by photolithography and patterning to selectively define a combined opening 115 comprising a portion of the opening 111 in the passivation layer 109 and an opening in the buffer layer 113. The combined opening 115 exposes a portion of the bond pad 107. The combined opening 115 has sidewalls 114.

Figure 4:
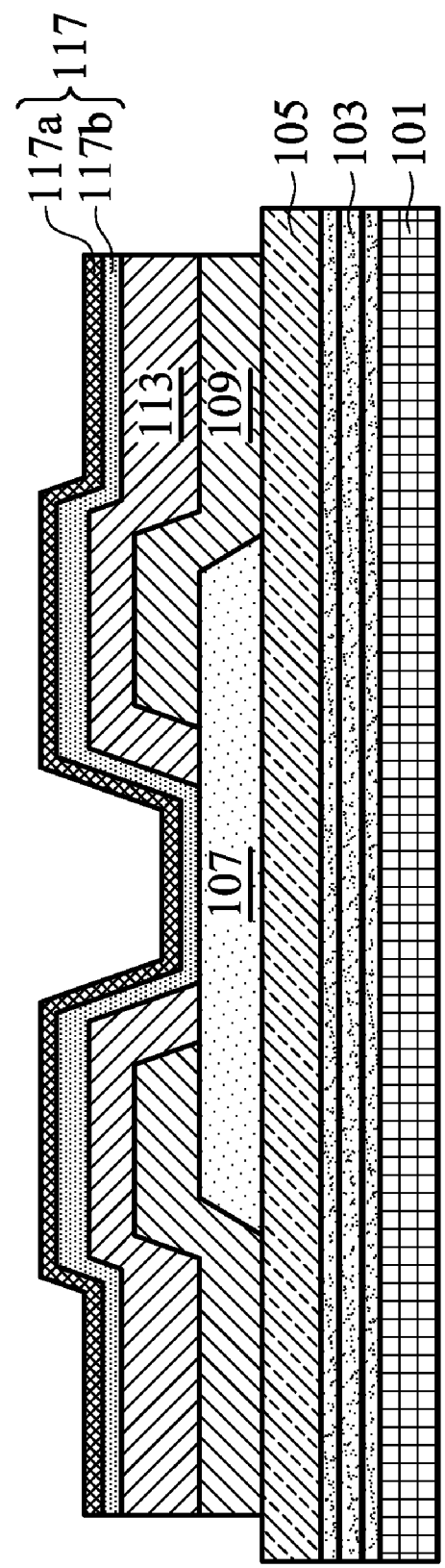

Referring to FIG. 4, an under bump metallurgy (UBM) layer 117 is formed over the buffer layer 113, lines the sidewalls 114 of the combined opening 115, and contacts the exposed portion of the bond pad 107. In some embodiments, the UBM layer 117 may include multiple layers of conductive materials, such as a layer of copper 117a and a layer of titanium 117b. Each layer in the UBM layer 117 may be formed using a plating process, such as electrochemical plating, although other processes of formation, such as sputtering, evaporation, electroless plating, or Plasma-enhanced chemical vapor deposition (PECVD), may alternatively be used depending upon the applied materials.

Figure 5:
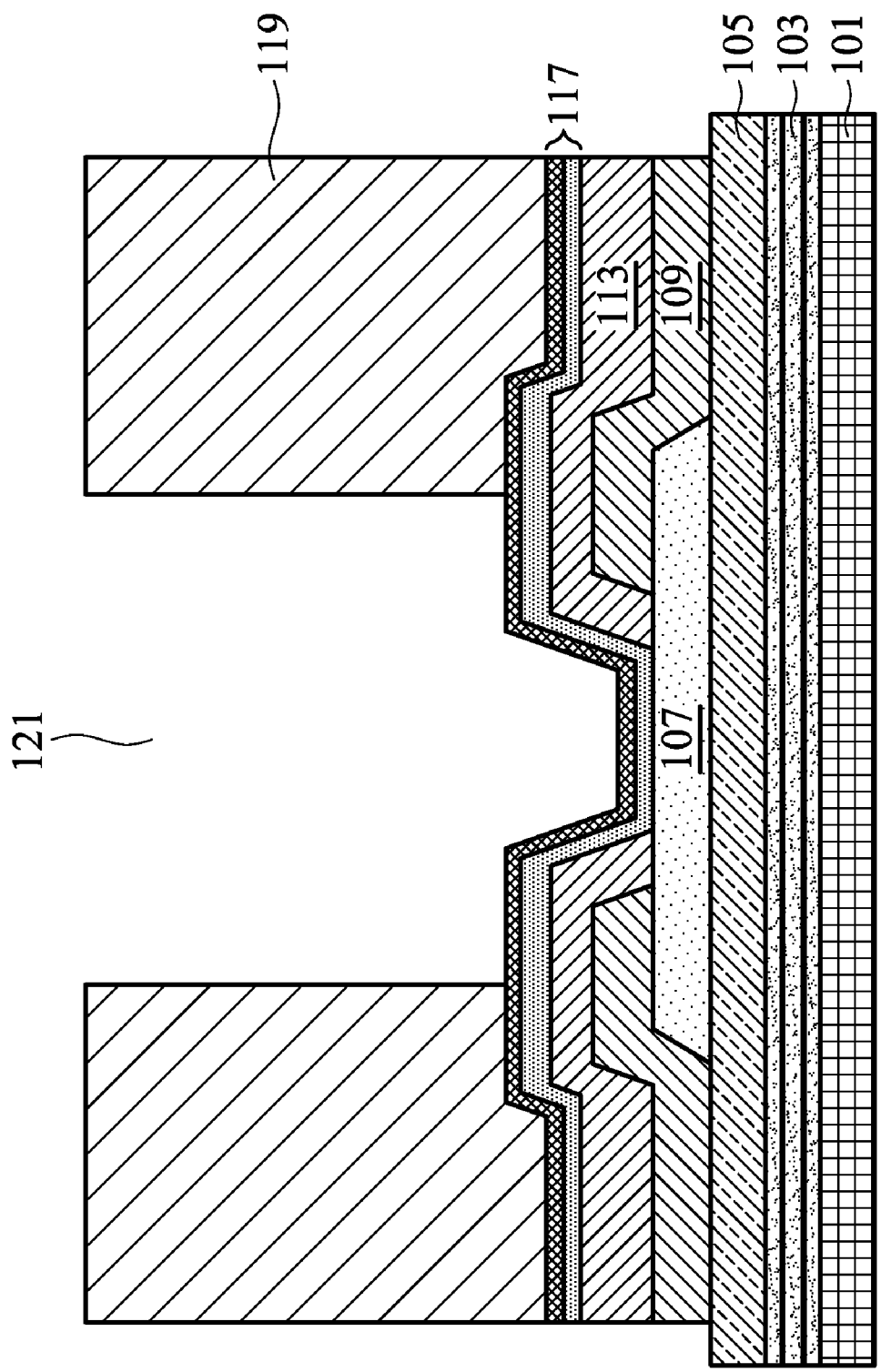

Next in FIG. 5, a photoresist layer 119 is formed over the UBM layer 117 and patterned to form a hole 121 that exposes a portion of the UBM layer 117 over at least the combined opening 115 and the exposed portion of the bond pad 107. The photoresist layer acts as a mold for a metal deposition process used for conductive bump formation. The photoresist material is one that is compatible with the process used to fill the opening.

Figure 6:
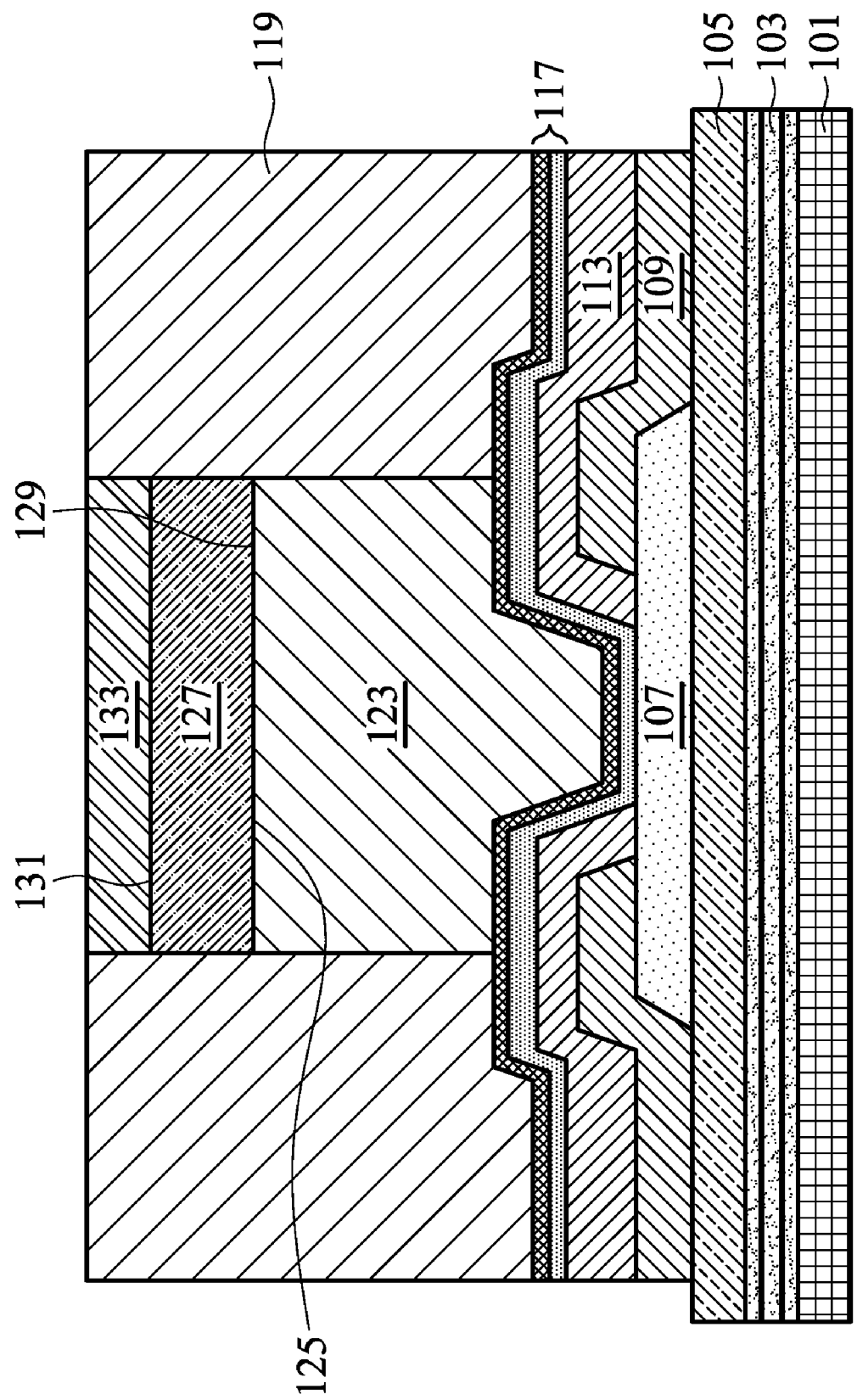

Referring to FIG. 6, a copper layer may be formed to fill a portion of the hole 121 by evaporation, electroplating, or screen printing to form a copper pillar 123 over the UBM layer 117. The copper pillar may be pure copper, or an alloy of copper. The copper pillar 123 has a top surface 125.

A nickel cap layer 127 is formed over the top surface 125 of the copper pillar 123 and fills a portion of the hole 121. In one embodiment, the nickel cap layer 127 is formed by immersing the substrate 101 in an electroless plating solution containing nickel. Nickel is deposited on the surface 125 of the copper pillar 123 by a chemical reaction process. The nickel cap layer 127 has a bottom surface 129 and a top surface 131. An interface is defined between the copper pillar 123 and the nickel cap layer 127.

Still referring to FIG. 6, a solder material 133 is deposited in the hole 121, the solder material 133 fills a portion of the hole 121 over the top surface 131 of the nickel cap layer 127. According to one embodiment, the solder material 133 comprises a lead-free solder or eutectic solder. The solder material 133 has a melting point lower than that of the copper pillar 123 and the nickel cap layer 127.

Figure 7:
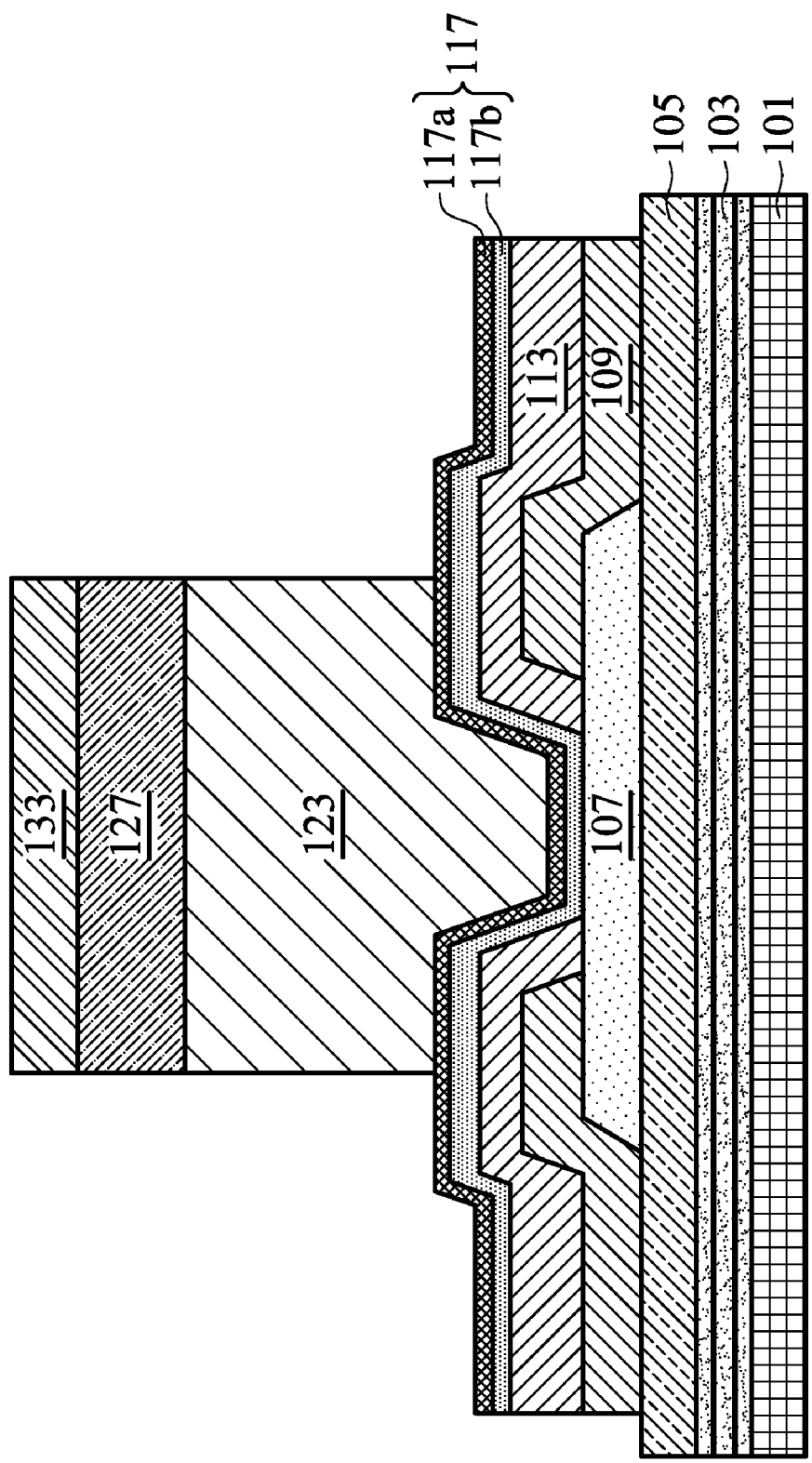

Referring to FIG. 7, the photoresist layer 119 is removed. The solder material 133, the nickel cap layer 127, the copper pillar 123 and the UBM layer 117 are then exposed.

Figure 8A:
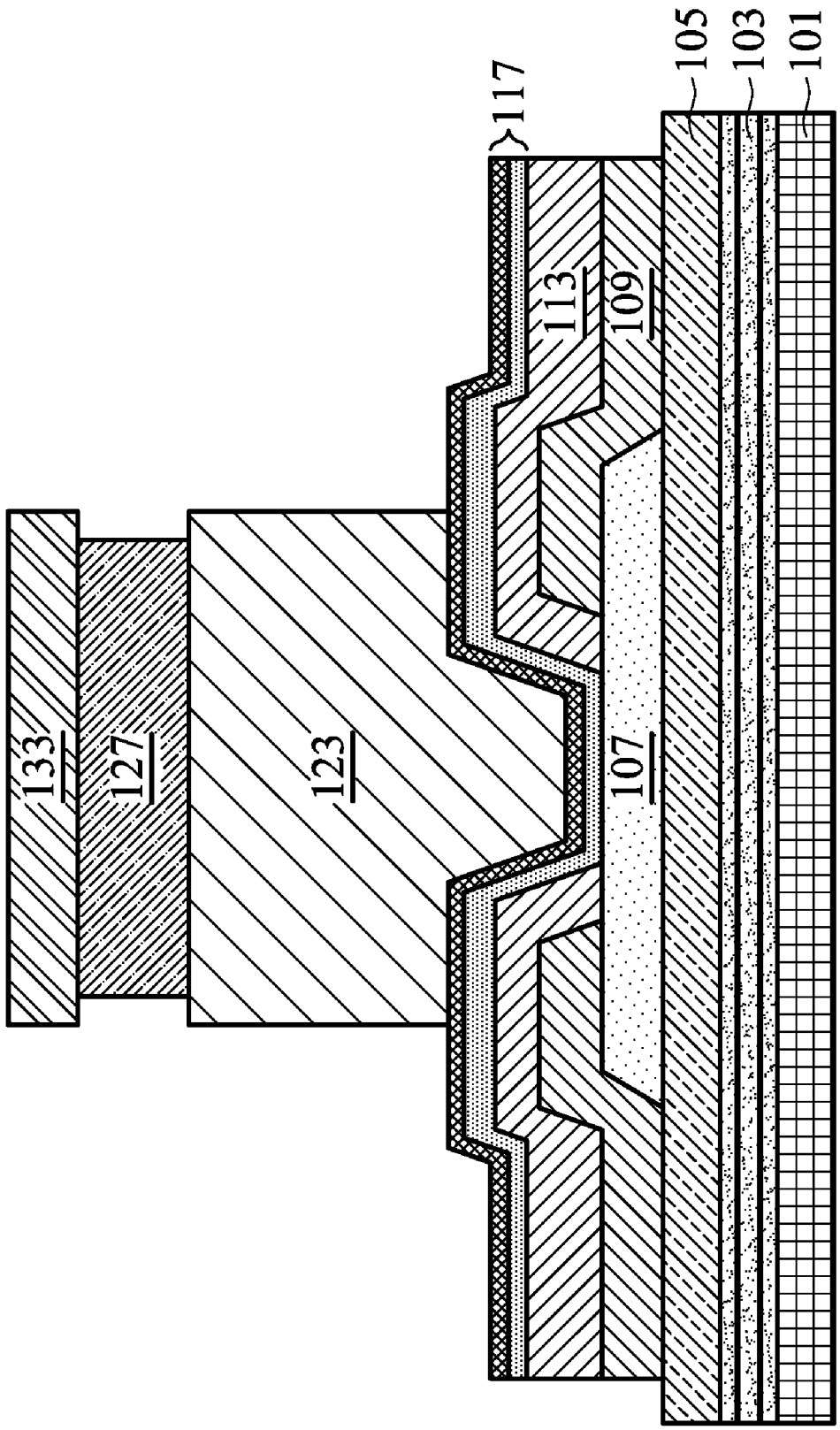

Referring to FIG. 8A, a first etching process is performed to etch the nickel cap layer 127. In one embodiment, the substrate 101 is immersed in an aqueous solution comprising 55% to 85% $H_3PO_4$ by volume, less than 1% Azole-based compound by volume, and less than 1% Sn by volume. In some embodiments, the aqueous solution comprises about 70% $H_3PO_4$ by volume. Without being bound by theory, it is believed that Azole-based compound inhibits etching of the copper, while the Sn inhibits etching of the solder. The solution may be maintained at a predetermined temperature within a range of about 30° C. to about 70° C. Since the etching reaction is suppressed on the surface of the copper pillar 123 and the solder material 133, the nickel cap layer 127 is selectively etched. In spite of the presence of the etch inhibitors, the aqueous solution still etches a small portion of the solder material 133 and the copper pillar 123. The relative etch rates in the aqueous solution of solder material 133 to the nickel cap layer 127 are less than $1/15$, and the relative etch rates of copper pillar 123 to the nickel cap layer 127 are less than $1/20$.

Figure 8B:
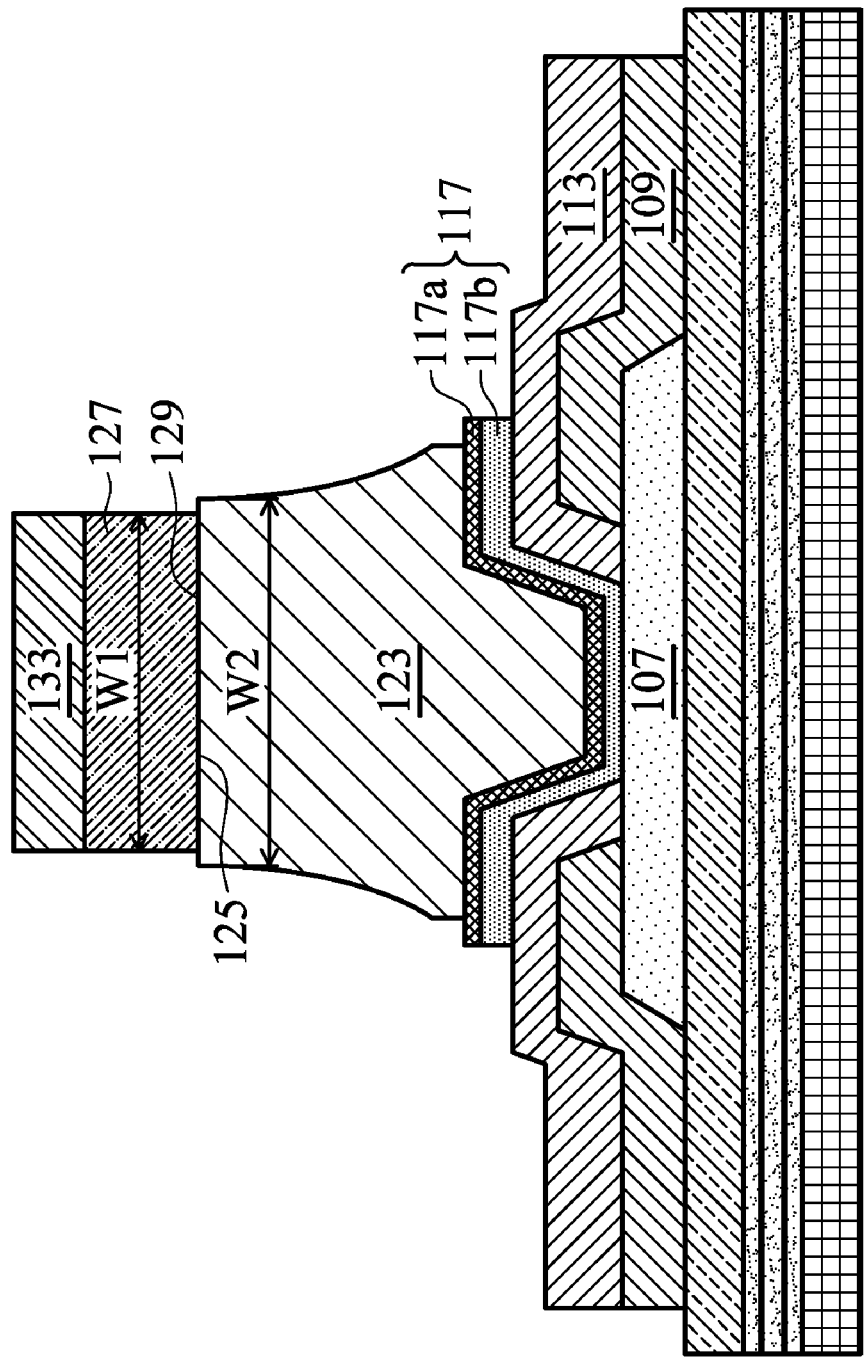

Referring to FIG. 8B, a second etching process is performed to etch the UMB layer 117. In one embodiment, first the copper layer 117a of the UBM layer 117 is wet etched in an aqueous solution comprising $NH_4OH$, $H_3PO_4$, $HNO_3$, HF or $H_2SO_4$. The copper pillar 123 has sidewalls with a concave shape after this wet etching process. Next, the layer of titanium 117b of the UBM layer 117 is wet etched in an aqueous solution comprising less than 1% HF by volume. In other embodiment, the layer of titanium 117b of the UBM layer 117 is dry etched in a gaseous environment containing Cl2, CFx or CHFx. The second etching process of the UBM layer 117 may comprise wet etching, dry etching or a combination thereof.

After the etching of UBM layer 117, an etched nickel cap layer 127 and an etched copper pillar 123 are produced. The etched nickel cap layer 127 has a first width W1. The first width W1 is adjacent to the interface of the etched nickel cap layer 127 and the etched copper pillar 123. In other words, the first width W1 is near the bottom surface 129 of the nickel layer 127. The etched copper pillar 123 has a second width W2. The second width W2 is adjacent to the interface of the etched nickel cap layer 127 and the etched copper pillar 123. In other words, the second width W2 is near the top surface 125 of the copper pillar 123. A ratio of the first width W1 to the second width W2 between is between about 0.93 to about 0.99. Regardless of the mechanism, the ratio of the first width W1 to the second width W2 may reduce stress at the interface of nickel cap layer 127 and the copper pillar 123. Such stress could generate cracks along the interface of copper pillar 123 and the underfill that is used to seal the space between the component and the die in the following process.

Figure 9:
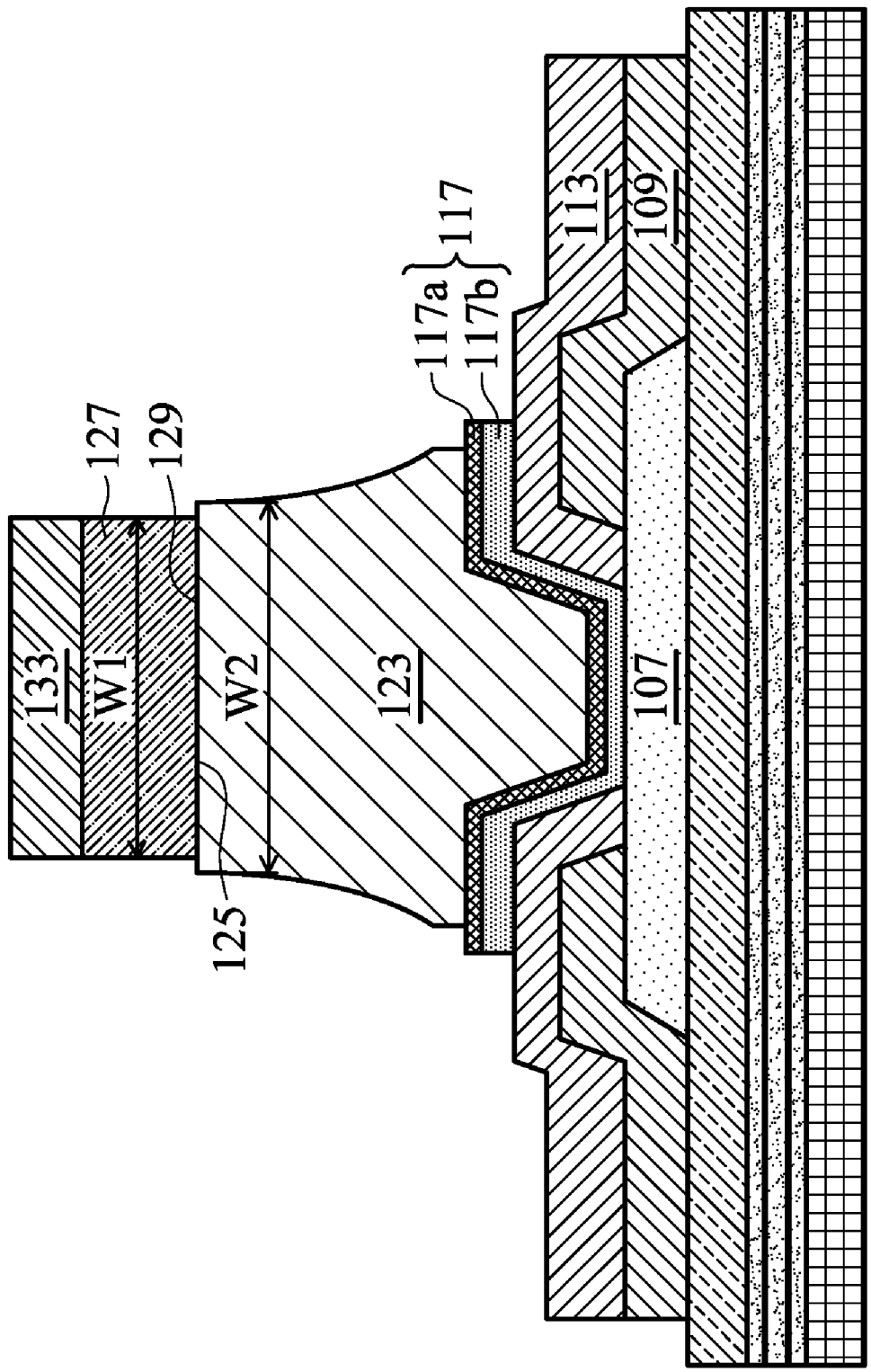

FIG. 9 illustrates a variation of the process steps of FIGS. 8A and 8B in which the nickel cap layer 127, the copper pillar 123 and the layer of copper 117a of the UBM layer 117 are simultaneously etched. In one embodiment, the substrate 101 is immersed in an aqueous solution comprising 36% to 42% $H_3PO_4$ by volume, 2% to 3% $HNO_3$ by volume, 44% to 49% CH3COOH by volume, and 2% to 3% Sn by volume. In some embodiments, the aqueous solution comprises about 40% $H_3PO_4$ by volume. It is believed that Sn suppresses the etching of the solder material 133. The solution may be maintained at a predetermined temperature within a range of about 30° C. to about 45° C. The relative etch rates in the aqueous solution of solder material 133 to the nickel cap layer 127 is less than $1/13$, and of copper pillar 123 to the nickel cap layer 127 is in a range of $1/3$ to 5. The copper pillar 123 has sidewalls with a concave shape after this wet etching process.

After the removal of a portion of the layer of copper 117a in the UBM layer 117, the layer of titanium 117b of the UBM layer 117 not covered by the layer of copper 117a could be wet etched or dry etched as previous described.

After the etching of UBM layer 117, an etched nickel cap layer 127 and the etched copper pillar 123 are produced. The etched nickel layer 127 has a first width W1. The first width W1 is adjacent to the interface of the etched nickel layer 127 and an etched copper pillar 123. Namely, the first width W1 is near the bottom surface 129 of the nickel cap layer 127. The etched copper pillar 123 has a second width W2. The second width W2 is adjacent to the interface of the etched nickel layer 127 and the etched copper pillar 123. Namely, the second width W2 is near the top surface 125 of the copper pillar 123. A ratio of the first width W1 to the second width W2 between is between about 0.93 to about 1.07. When the ratio is 1, there is a smooth interface between the copper pillar 123 and the nickel cap layer 127. Regardless of the mechanism, the ratio of the first width W1 to the second width W2 may reduce stress at the interface of nickel cap layer 127 and the copper pillar 123. Such stress may generate cracks along the interface of copper pillar 123 and the underfill that is used to seal the space between the component and the die in the following process.

Figure 10:
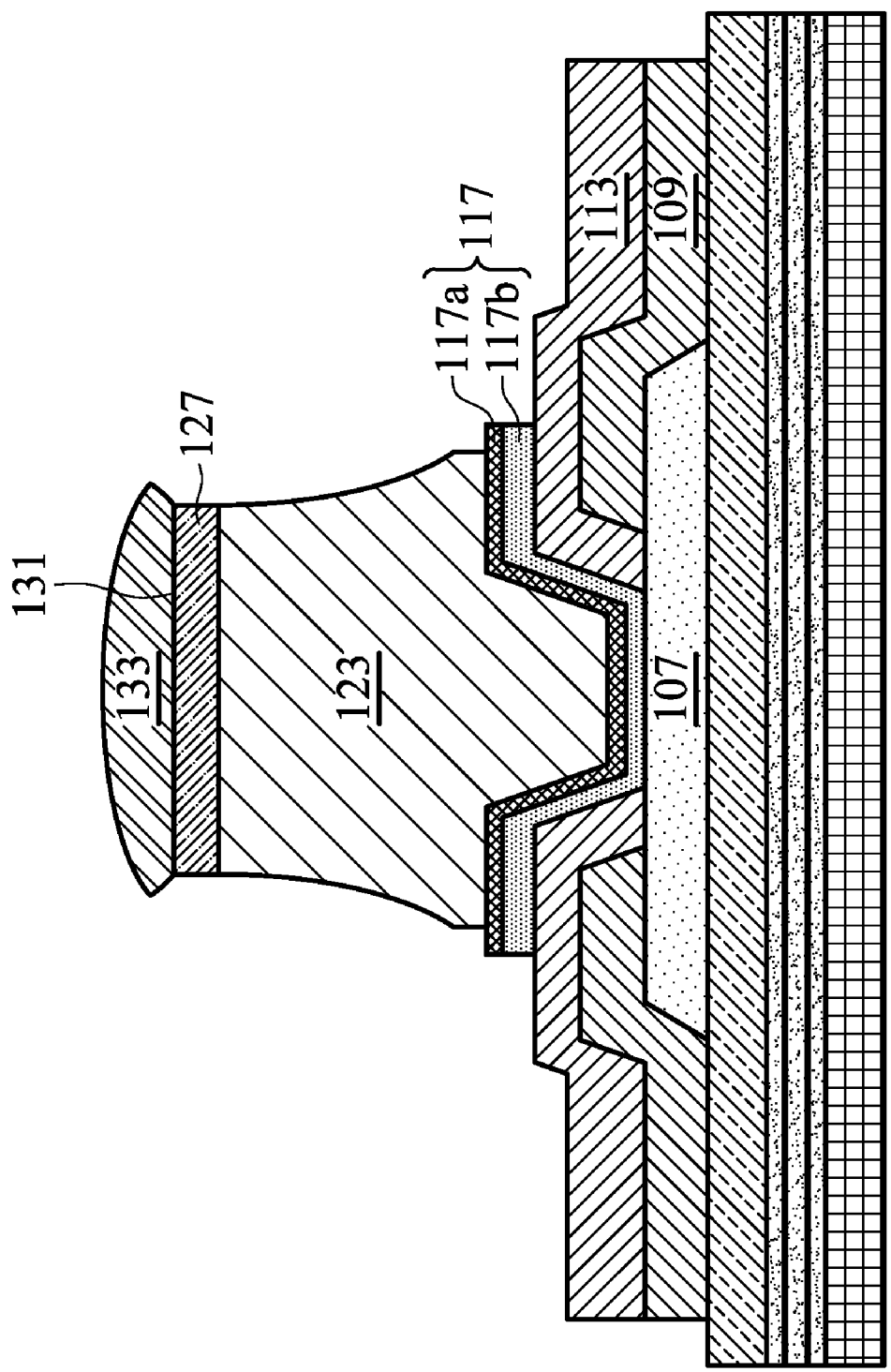

Referring to FIG. 10, the solder material 133 is reflown to cover the top surface 131 of the nickel cap layer 127. The reflow process may soften and/or melt the solder material 133 but not the nickel cap layer 127 and the copper pillar 123 such that the solder material 133 may flow along the top surface 131.

Figure 11:
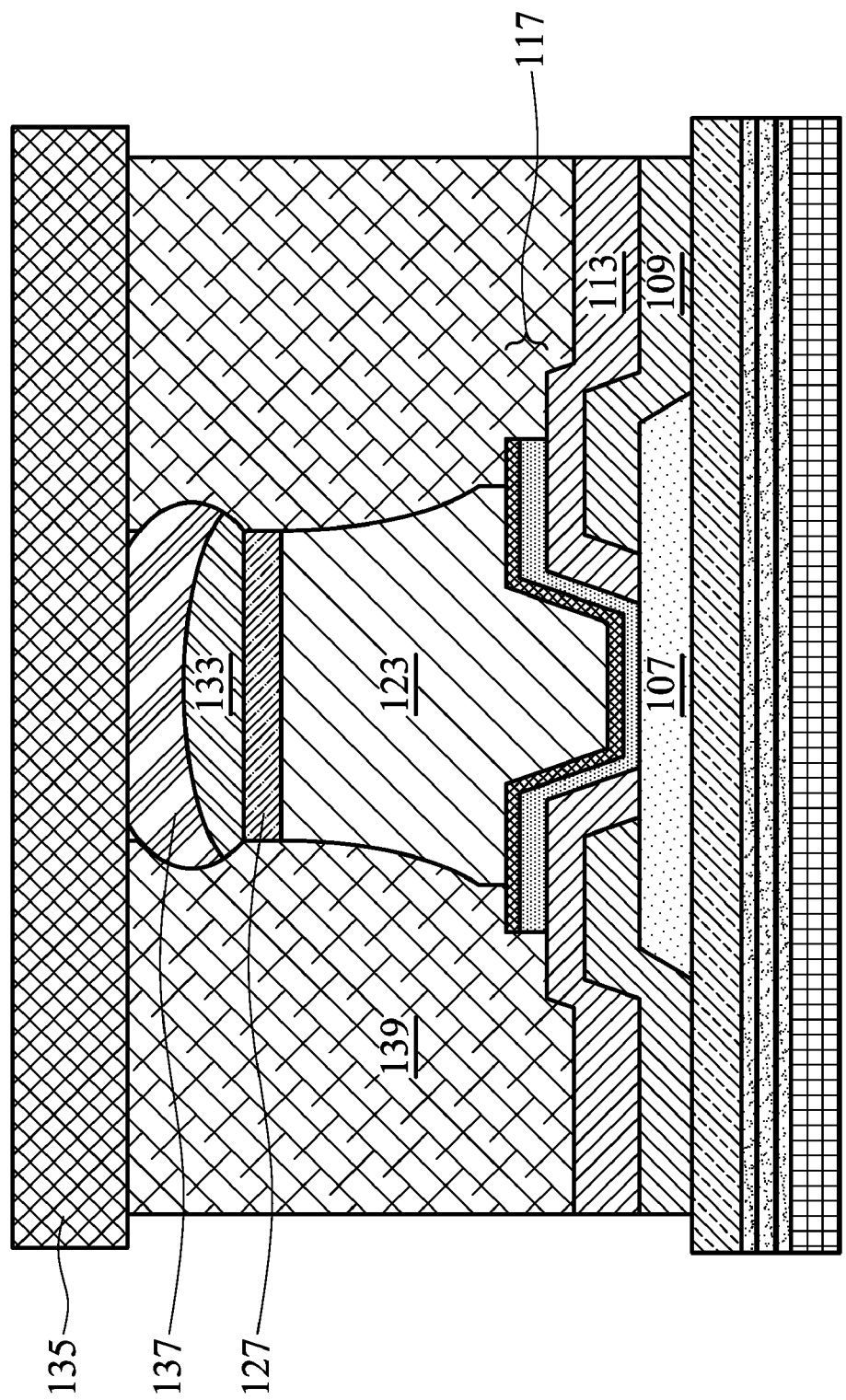

The FIG. 11 illustrates a cross-sectional view of the previously described copper pillar structure after it has been bonded to a component 135. For the sake of simplicity and brevity, the component 135 is shown as a simple chip without further details. In one embodiment, the component 135 may include semiconductor chip, package substrate, circuit board, or any suitable component being familiar to those skilled in the art. The substrate 101 and the component 135 could be electrically connected through the copper pillar 123. In one embodiment, the bonding method places a solder 137 on the solder material 133 to bond the copper pillar 123 and the component 133.

After the bonding process, a gap is defined between the substrate 101 and the electrical component 133. An underfill 139 may be filled in this gap to protect the copper pillar 123 and increase the reliability of the package. The underfill 139 reduces stress between the copper pillar 123, the substrate 101, and the component 133, and spreads the heat uniformly within this stacked electrical component. The underfill 139 may include, but is not limited to, epoxies, polyimides, other thermoplastic or thermoset materials, or any suitable material being familiar to those skilled in the art.

Figure 12:
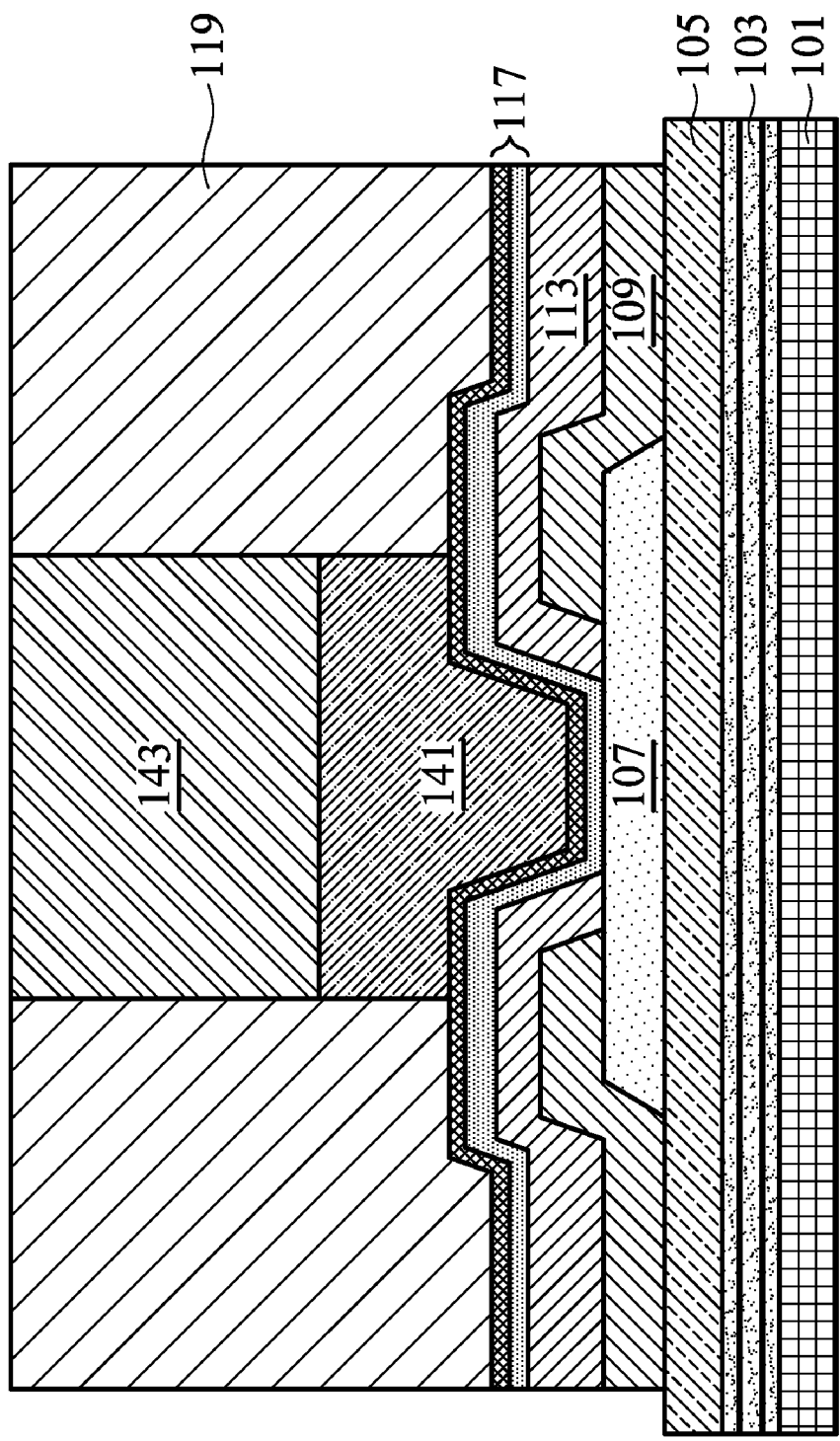
Figure 13:
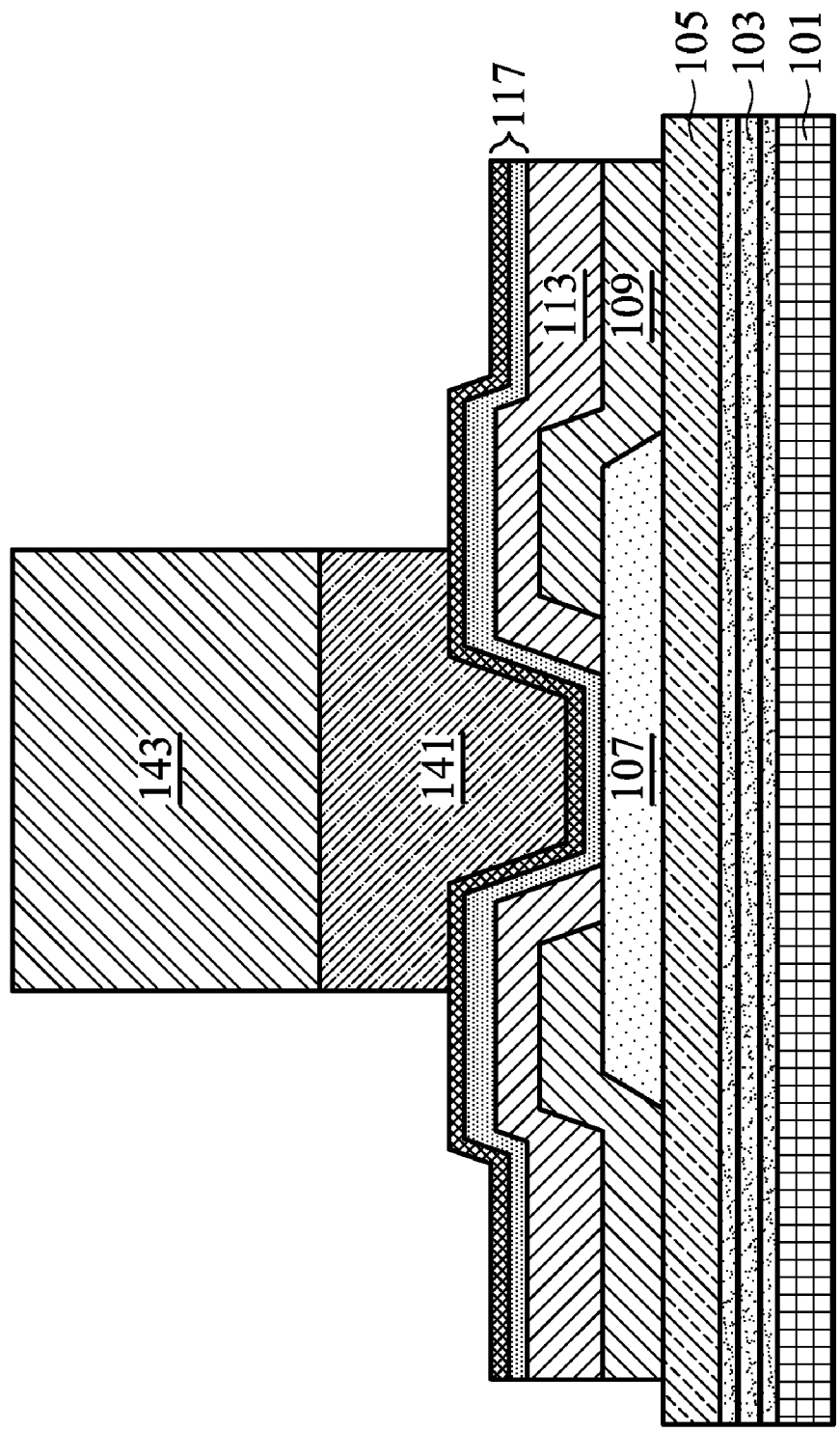
Figure 14:
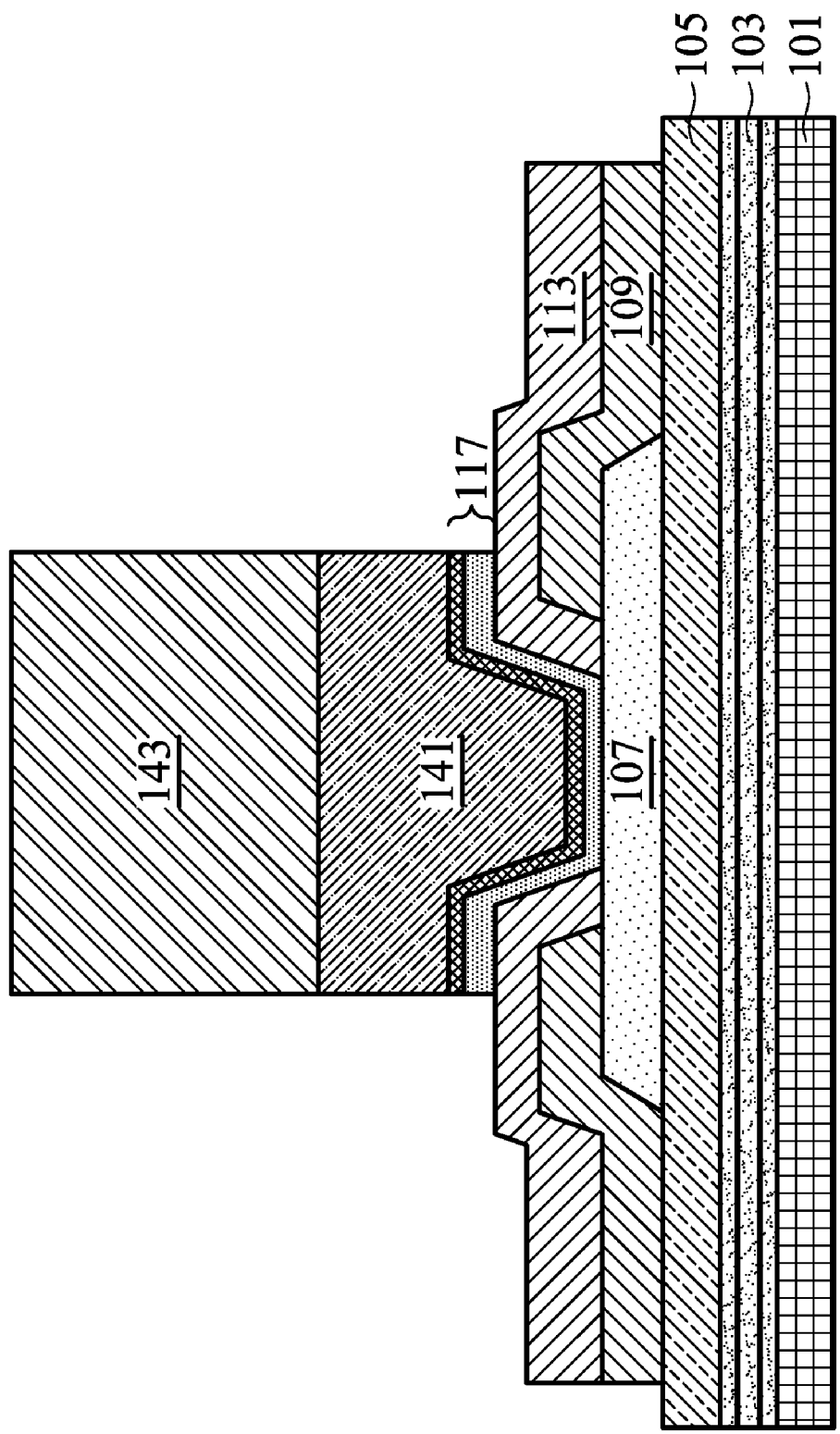

FIG. 12 to FIG. 14 illustrate a variation of the process steps of FIG. 6 to FIG. 9 in the formation a conductive bump. The repetitive numerals in FIG. 12 refer to the same or similar elements shown in FIG. 6.

Referring to FIG. 12, a nickel layer 141 is formed over the UBM layer 117 and fills a portion of the hole 121. In one embodiment, the nickel layer 141 is formed by immersing the substrate 101 in an electroless plating solution containing nickel. Nickel is then deposited on the surface of UBM layer 117 by a chemical reaction process. Next, a solder material 143 is deposited in the hole 121, the solder material 143 filling a portion of the hole 121 over the top surface of the nickel layer 141. According to one embodiment, the solder material 143 comprises a lead-free solder or eutectic solder.

Referring to FIG. 13, the photoresist layer 119 is removed. The solder material 143, the nickel layer 141 and the UBM layer 171 are exposed.

Referring to FIG. 14, the nickel layer 141, and the layer of copper 117 a of the UBM layer 117 are simultaneously etched. In one embodiment, the substrate 101 are immersed in an aqueous solution comprising 36% to 42% $H_3PO_4$ by volume, 2% to 3% $HNO_3$ by volume, 44% to 49% CH3COOH by volume, and 2% to 3% Sn by volume. In some embodiments, the aqueous solution comprises about 40% $H_3PO_4$ by volume. It is believed that Sn inhibits etching of the solder. The solution may be maintained at a predetermined temperature within a range of about 30° C. to about 45° C. The relative etch rates in the aqueous solution of solder material 143 to the nickel layer 141 are less than $1/13$, and of the layer of copper 117a to the nickel layer 141 are in a range of $1/3$ to 5. The etching process may generate a smooth interface between the nickel layer 141 and the layer of copper 117a of the UBM layer 117. The smooth interface may reduce stress that generates cracks to underlying low-k dielectric materials. Accordingly, some of the shortcomings of the conventional solder bump manufacturing processes are moderated.

After the removal of the layer of copper 117a not covered by the nickel layer 141, the layer of titanium 117b of the UBM layer 117 not covered by the layer of copper 117a is etched in an aqueous solution comprising less than 1% HF by volume. In other embodiment, the layer of titanium 117b of the UBM layer 117 is dry etched in a gaseous environment containing Cl2, CFx or CHFx. The etching process of the UBM layer 117 may comprise wet etching, dry etching or a combination thereof.

Various embodiments of the present invention may be used to moderate the shortcomings of conventional conductive bump manufacturing processes. For example, a proper range of the ratio of the first width W1 and the second width W2 will reduce stress that generates cracks along the interface of conductive pillar 123 and the solder 133/137 that is used to bond the component in the following process. The various embodiments provide a properly shaped interface between the nickel cap layer 127 and the copper pillar 123, and nickel layer 141 and the UBM layer 147. The yield of assembly will be improved Although the embodiments and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:
1. A method of forming a semiconductor die comprising:
providing a substrate;
forming a bond pad over the substrate;
depositing an under bump metallurgy (UBM) layer over the bond pad;
forming a copper pillar over the UBM layer;

depositing a nickel layer over the copper pillar, wherein an interface is defined between the nickel layer and the copper pillar;

depositing a solder material over the nickel layer;

etching the nickel layer and the copper pillar in an aqueous solution comprising 55% to 85% $H_3PO_4$ by volume, less than 1% Azole-based compound by volume, and less than 1% Sn by volume; and etching the UBM layer after the step of etching the nickel layer and the copper pillar.

2. The method of claim 1, wherein the step of etching in the aqueous solution is performed at a temperature in the range of 30° C. and 70° C.

3. The method of claim 1, wherein the aqueous solution comprises about 70% $H_3PO_4$ by volume.

4. The method of claim 1, wherein after the two etching steps the etched copper pillar adjacent to the interface has a first width, the etched nickel layer adjacent to the interface has a second width, and a ratio of the second width to the first width is between about 0.93 to about 0.99.

5. The method of claim 1, wherein the solder material comprises lead free solder.

6. The method of claim 1, wherein the etching of the UBM layer comprises wet etching, dry etching, or a combination thereof.

7. The method of claim 1, wherein the conductive pillar has a concave shape.

8. A method of forming a semiconductor die comprising:

providing a substrate;

forming a bond pad over the substrate;

depositing an under bump metallurgy (UBM) layer comprising copper over the bond pad;

depositing a nickel layer over the UBM layer;

depositing a solder material over the nickel layer; and etching the nickel layer and the UBM layer in an aqueous solution comprising 36% to 42% $H_3PO_4$ by volume, 2% to 3% $HNO_3$ by volume, 44% to 49% $CH_3COOH$ by volume, and 2% to 3% Sn by volume.

9. The method of claim 8, wherein the step of etching in the aqueous solution is performed at a temperature in the range of 30° C. and 45° C.

10. The method of claim 8, wherein the aqueous solution comprises about 40% $H_3PO_4$ by volume.

11. The method of claim 8, further comprising forming a copper pillar over the UBM layer and underlying the nickel layer, thereby forming an interface between the copper pillar and the nickel layer.

12. The method of claim 11, wherein the copper pillar adjacent to the interface has a first width, the nickel layer adjacent to the interface has a second width, and a ratio of the second width to the first width is between about 0.93 to about 1.07.

13. The method of claim 8, wherein the UBM layer further comprises titanium.

14. The method of claim 13, further comprising etching the UBM layer comprising titanium in an aqueous solution comprising less than 1% HF by volume.

15. The method of claim 13, further comprising etching the UBM layer comprising titanium in a gaseous environment containing Cl2, CFx or CHFx.

16. The method of claim 8, wherein the solder material comprises lead free solder.

* * * * *